United States Patent
Kinderman et al.

(10) Patent No.: US 9,891,281 B1
(45) Date of Patent: Feb. 13, 2018

(54) METHOD AND SYSTEM FOR AUTOMATICALLY IDENTIFYING TEST RUNS CONTRIBUTING TO COVERAGE EVENTS OF INTEREST IN VERIFICATION TEST DATA

(71) Applicant: Cadence Design Systems, Inc., San Jose, CA (US)

(72) Inventors: Yael Kinderman, Givat Shmuel (IL); Erez Bashi, Kibbutz Naan (IL); Oded Oren, Tel-Aviv (IL)

(73) Assignee: Cadence Design Systems, Inc., San Jose, CA (US)

( * ) Notice: Subject to any disclaimer, the term of this patent is extended or adjusted under 35 U.S.C. 154(b) by 206 days.

(21) Appl. No.: 14/953,463

(22) Filed: Nov. 30, 2015

(51) Int. Cl.
| | |
|---|---|
| *G06F 17/50* | (2006.01) |
| *G01R 31/00* | (2006.01) |
| *G01R 31/3177* | (2006.01) |
| *G01R 31/26* | (2014.01) |
| *G01R 31/28* | (2006.01) |

(52) U.S. Cl.
CPC ..... *G01R 31/3177* (2013.01); *G06F 17/5009* (2013.01); *G06F 17/5081* (2013.01); *G01R 31/26* (2013.01); *G01R 31/2803* (2013.01); *G06F 17/504* (2013.01)

(58) Field of Classification Search
None
See application file for complete search history.

(56) References Cited

U.S. PATENT DOCUMENTS

| | | | | |
|---|---|---|---|---|
| 5,202,889 | A * | 4/1993 | Aharon | G01R 31/31704 714/736 |
| 5,684,946 | A * | 11/1997 | Ellis | G06F 17/5022 714/33 |
| 6,530,054 | B2 * | 3/2003 | Hollander | G01R 31/31704 714/739 |
| 6,564,356 | B1 * | 5/2003 | Malik | G01R 31/318335 716/106 |
| 6,928,638 | B2 * | 8/2005 | Parvathala | G06F 11/263 714/25 |
| 7,114,111 | B2 * | 9/2006 | Noy | G01R 31/31707 714/738 |
| 7,181,376 | B2 * | 2/2007 | Fine | G06F 11/261 703/13 |
| 7,203,882 | B2 * | 4/2007 | Fine | G01R 31/31813 714/724 |
| 7,281,185 | B2 * | 10/2007 | Maoz | G01R 31/31707 714/738 |
| 7,617,468 | B2 * | 11/2009 | Thakur | G06F 17/5081 703/14 |
| 7,831,879 | B2 * | 11/2010 | Ditmyer | G06F 11/261 714/26 |

(Continued)

*Primary Examiner* — Leigh Garbowski
(74) *Attorney, Agent, or Firm* — Pearl Cohen Zedek Latzer Baratz LLP (57) ABSTRACT

A method includes receiving from a user, via a user interface, coverage-event characteristics. Using a processor, output data of test runs executed on a device-under-test is analyzed to identify one or a plurality of coverage events that possess the coverage-event characteristics and to identify one or a plurality of contributing test runs in said test runs that contributed to said one or a plurality of coverage events. Information on said one or a plurality of contributing test runs is outputted via an output device.

11 Claims, 3 Drawing Sheets

(56) References Cited

U.S. PATENT DOCUMENTS

| | | | | |
|---|---|---|---|---|
| 7,836,416 B2* | 11/2010 | Schubert | ............ | G06F 17/5022 |
| | | | | 703/13 |
| 7,886,242 B1* | 2/2011 | Chakraborti | ... | G01R 31/318307 |
| | | | | 716/106 |
| 8,145,949 B2* | 3/2012 | Silver | ................ | G06F 11/3688 |
| | | | | 714/25 |
| 8,214,782 B1* | 7/2012 | Chakraborti | ... | G01R 31/318307 |
| | | | | 716/106 |
| 8,397,200 B2* | 3/2013 | Hsiong | ................ | G06F 11/263 |
| | | | | 324/500 |
| 8,719,799 B2* | 5/2014 | Adler | ................ | G06F 11/3676 |
| | | | | 714/36 |
| 8,826,202 B1* | 9/2014 | Goel | .................... | G06F 11/263 |
| | | | | 716/106 |
| 9,098,637 B1* | 8/2015 | Sahu | ................... | G06F 11/3692 |
| 9,558,307 B1* | 1/2017 | Yanai | ................... | G06F 17/5045 |
| 2002/0121913 A1* | 9/2002 | Miller | ............... | G01R 31/2874 |
| | | | | 324/750.05 |
| 2006/0294503 A1* | 12/2006 | Henderson | .......... | G06F 11/3604 |
| | | | | 717/131 |
| 2007/0266349 A1* | 11/2007 | Craig | ............ | G01R 31/318385 |
| | | | | 716/106 |
| 2015/0301108 A1* | 10/2015 | Hamid | ............... | G01R 31/3177 |
| | | | | 714/724 |
| 2016/0210226 A1* | 7/2016 | Hall | ................... | G06F 11/3672 |
| 2016/0266203 A1* | 9/2016 | Hamid | ............... | G01R 31/3177 |
| 2017/0010325 A1* | 1/2017 | Subbarayan | ..... | G01R 31/31835 |

\* cited by examiner

METHOD AND SYSTEM FOR AUTOMATICALLY IDENTIFYING TEST RUNS CONTRIBUTING TO COVERAGE EVENTS OF INTEREST IN VERIFICATION TEST DATA

FIELD OF THE INVENTION

The present disclosure relates to coverage metrics in verification. More specifically, the present invention relates to method and system for automatically identifying test runs contributing to coverage events of interest in verification test data.

BACKGROUND OF THE INVENTION

Prior to hardware fabrication, one technique of examining and verifying a design of a hardware component, such as an integrated circuit, is to model the operation of the design in software and then perform verification testing on the model. For the purpose of modeling the design, the functionality may be described, for example, using a hardware design language (HDL) such as Verilog. HDL may represent various functions or operations of the hardware design as separate models or statements in the HDL code.

The software emulation of the hardware (referred to, hereinafter as "source code") may be operated in different configurations to test or verify operation of various functionalities of the hardware component. A test may cause execution of all or some of the statements in the HDL code. A fraction or percentage of the statements or other entities in the HDL code that are covered by a test may be referred to as coverage. Coverage may relate to the entire set of HDL code, or to a part or block of the HDL code. Coverage may also refer to code (e.g., whether a block of code has been executed during a test), expressions (e.g., whether all possibilities in a truth table have been covered by a test), functionality, or other facets of the emulation.

SUMMARY OF THE INVENTION

There is thus provided, in accordance with some embodiments of the present invention, a method including receiving from a user, via a user interface, coverage-event characteristics; using a processor, analyzing output data of test runs executed on a device-under-test to identify one or a plurality of coverage events that possess the coverage-event characteristics and to identify one or a plurality of contributing test runs in said test runs that contributed to said one or a plurality of coverage events; and outputting information on said one or a plurality of contributing test runs via an output device.

Furthermore, in accordance with some embodiments of the present invention, the test runs include individual test runs.

Furthermore, in accordance with some embodiments of the present invention, the test runs include merges of individual test runs.

Furthermore, in accordance with some embodiments of the present invention, analyzing the output data of the test runs is carried out using a plurality of processing units.

Furthermore, in accordance with some embodiments of the present invention, the method includes improving coverage analysis by using the outputted information.

Furthermore, in accordance with some embodiments of the present invention, the method includes redefining the coverage-event characteristics for subsequent verification analyses by using the outputted information.

Furthermore, in accordance with some embodiments of the present invention, the device-under-test includes a hardware device.

There is further provided, in accordance with some embodiments of the present invention, a non-transitory computer readable storage medium having stored thereon instructions that when executed by a processor will cause the processor to receive from a user, via a user interface, coverage-event characteristics; analyze output data of test runs executed on a device-under-test to identify one or a plurality of coverage events that possess the coverage-event characteristics and to identify one or a plurality of contributing test runs in said test runs that contributed to said one or a plurality of coverage events; and output information on said one or a plurality of contributing test runs via an output device.

There is further provided, in accordance with some embodiments of the present invention, a system including a processor and a memory. The processor is configured to receive from a user, via a user interface, coverage-event characteristics; analyze output data of test runs executed on a device-under-test to identify one or a plurality of coverage events that possess the coverage-event characteristics and to identify one or a plurality of contributing test runs in said test runs that contributed to said one or a plurality of coverage events; and output information on said one or a plurality of contributing test runs via an output device.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

Verification testing of hardware components in software may be implemented using a representation of the hardware component to be validated (e.g., the device under test (DUT) using HDL models, for example). Different input data items, or stimuli, are applied to the DUT. The system then examines the output responses to the specific inputs to verify that the DUT is functioning properly. A user is concerned with analyzing what needs to be verified in the DUT and how, as well as setting the appropriate input metrics that would allow determining progress towards converging to desired validation goals, such as desired coverage levels.

Coverage is a metric used during validation to assess whether certain metrics of the design were tested during a particular run. The quality of verification is measured using coverage tools. Code coverage is concerned with line or block coverage, arc coverage for state machines, expression coverage, event coverage and toggle coverage. For example, in code coverage, the coverage tool may evaluate what portion of the source code was actually executed during the run for a given set of input metrics.

Functional coverage is concerned with the coverage of the functionalities of the DUT. Functional coverage features may include coverage of variables and expressions, as well as cross coverage between them, automatic and user-defined coverage bins, associate bins with sets of values, transitions and cross products, filtering conditions at multiple levels, events and sequences to automatically trigger coverage sampling, procedural activation and query of coverage, and optional directives to control and regulate coverage. Functional verification involves changing the state of a logic design and verifying (by conducting various measurements) that the response generated by the design is correct (matches the planned response). Verification environments in software change the state of the DUT by driving stimuli in the form of directed or constrained random inputs.

Verification analyses can be performed on DUTs ranging from small stand-alone hardware projects to large scale system-on-chip projects requiring millions of runs, gigabytes of coverage data, and a multitude of active and executable verification plans. A major problem during verification is the enormous amounts of test data that are generated. The coverage tool may be used to process the vast amounts of generated verification data so as to extract the desired coverage information. In some embodiments, the verification environment may include the coverage tool that can be called by the user to evaluate coverage on the verification test data on the DUT. In other embodiments, the coverage tool may be a separate stand-alone routine. In some embodiments, the coverage tool may be implemented in hardware.

When preparing for DUT verification, a user typically considers two models:

a) a generation model, which essentially is a set of definitions and constraints relating to the stimuli to be generated; and b) a coverage model, which includes coverage requirements and is aimed at making sure that the verification testing of the DUT is properly covered. In some embodiments, the coverage model may be defined based on inputs which are necessary and it is therefore required to "direct" the stimuli generator to generate such inputs. In some embodiments, the coverage model may be defined based on the expected outputs and their distribution, and may involve extracting from the expected outputs inputs that it is desired to obtain from the stimuli generator. In some embodiments, the coverage model may be defined based on expected events within the DUT (e.g., considering segments of the DUT). In some embodiments, the user may apply random stimuli to the DUT generated from a random seed. A given verification test may be repeated by using the same random seed.

Figure 1:
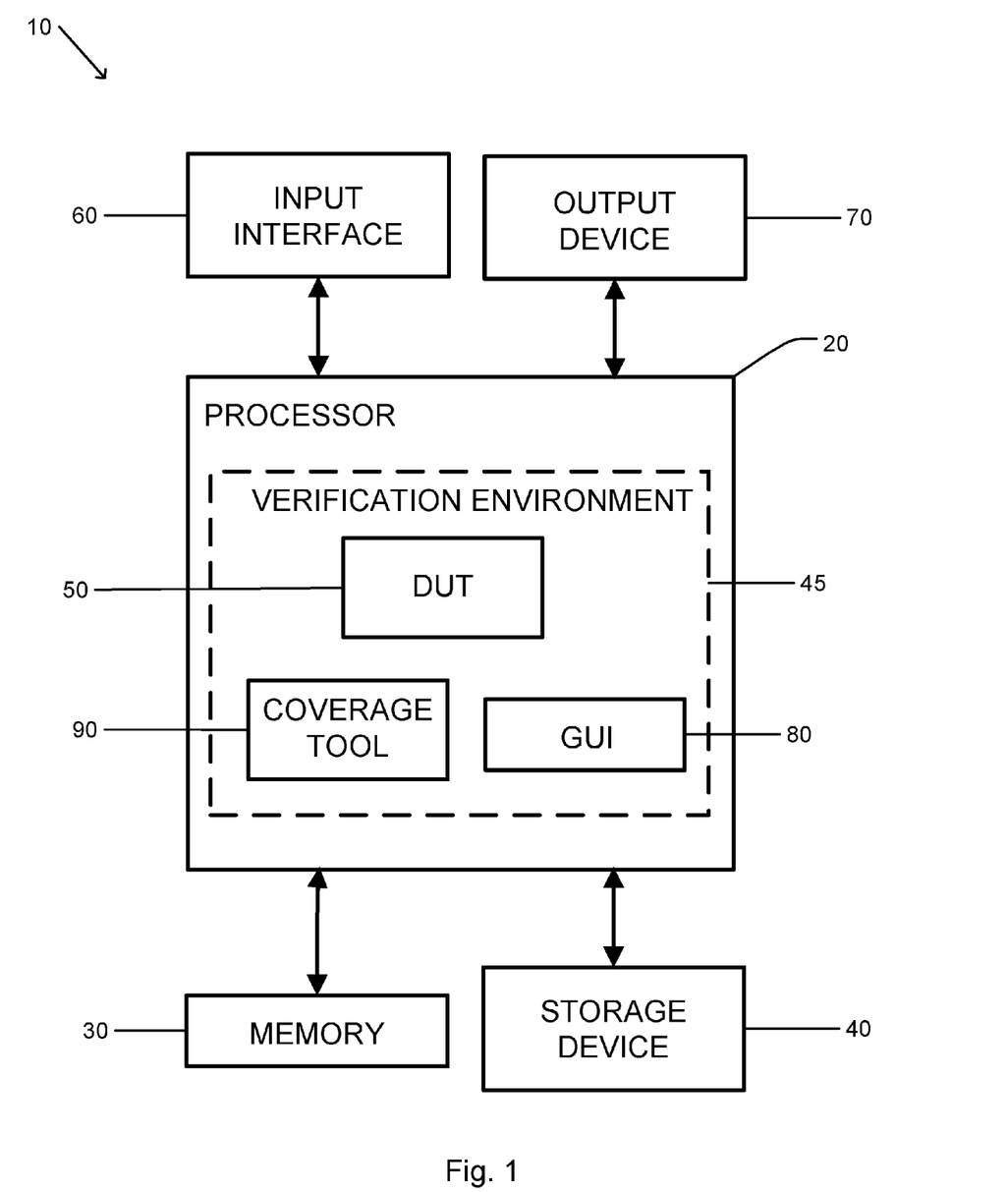
FIG. 1 schematically illustrates a system for automatically identifying test runs contributing to coverage events of interest in verification test data, in accordance with some embodiments of the present invention.

FIG. 1 schematically illustrates a system 10 for automatically identifying test runs contributing to coverage events of interest in verification test data, in accordance with some embodiments of the present invention. System 10 includes a processing unit 20 (e.g., one or a plurality of processors, on a single machine or distributed on a plurality of machines) for executing a method according to some embodiments of the present invention.

Processing unit 20 is linked with memory 30 on which a program implementing a method according to some embodiments of the present invention and corresponding data may be loaded and run from and data may be saved, and a storage device 40, which includes a non-transitory computer readable medium (or mediums) such as, for example, one or a plurality of hard disks, flash memory devices, etc. on which a program implementing a method according to some embodiments of the present invention and corresponding data may be stored.

Processor 20 performs the functions described herein within a verification environment 45 as shown schematically in FIG. 1. Specifically, processor 20 performs verification testing on a device-under-test (DUT) 50. The test data results may be stored in memory 30, in storage device 40, or in both.

System 10 includes an input interface 60 for receiving data and instructions from a user, such as, for example, one or a plurality of keyboards, pointing devices, touch sensitive surfaces (e.g., touch sensitive screens), etc. for allowing a user to input commands and data. System 10 further includes an output device 70 (e.g., display device such as CRT, LCD, LED, etc.) on which one or a plurality user interfaces associated with a program implementing a method according to some embodiments of the present invention and corresponding data may be presented. The user inputs and data outputs from verification environment 50 are controlled by a graphic user interface (GUI) 80. A coverage tool 90 in verification environment 45 is used to analyze the coverage metrics mentioned previously from the verification test data from DUT 50 by the methods described hereinbelow.

System 10 is shown in FIG. 1 by way of example for conceptual clarity and not by way of limitation of some embodiments of the present invention. For example, in some embodiments of the present invention, DUT 50 shown in FIG. 1 as implemented in software, may be alternatively implemented in a stand-alone, or separate, hardware device. In the latter case, system 10 can be adapted mutatis mutandis to input the appropriate test stimuli to and to receive test results from the stand-alone hardware DUT.

Some embodiments of the present invention may be implemented in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with some embodiments of the present invention.

In some embodiments, the instructions stored on the computer readable medium may be in the form of an installed application and in the form of an installation package. Such instructions may be, for example, loaded by one or more processors and get executed. For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof. Computer program code is written in programming language, and may be executed on a single computer system, or on a plurality of computer systems.

Figure 2:
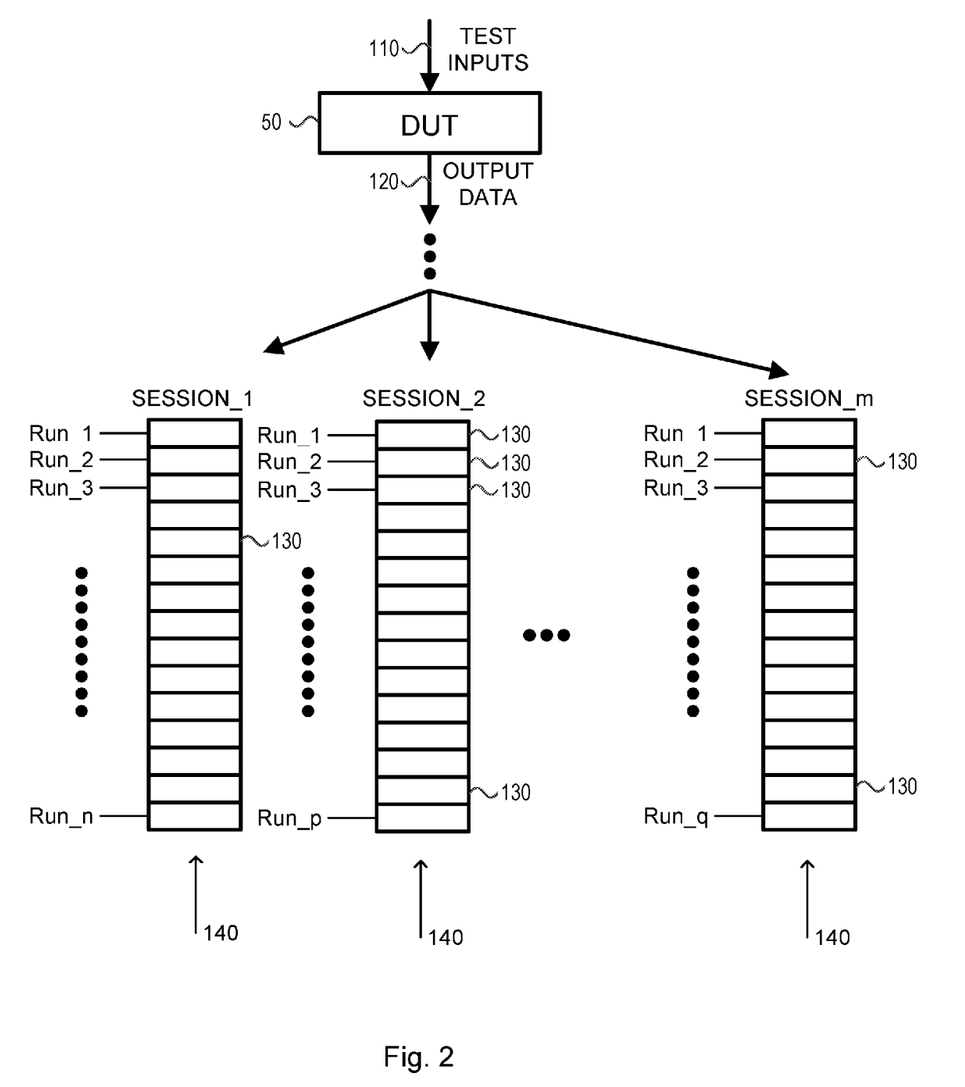
FIG. 2 illustrates the management of output data during verification testing of a device-under-test (DUT), in accordance with some embodiments of the present invention.

FIG. 2 illustrates the management of output data during verification testing of DUT 50, in accordance with some embodiments of the present invention. The user may define a series of tests to be performed on DUT 50 via GUI 80 or use tests that were prepared in advance. Processor 20 then applies appropriate test inputs 110 to DUT 50 based on the defined tests. Processor 20 computes output data 120 during multiple test runs 130 during each test session 140 in accordance with the tests, which may take hours or even days to execute, depending on the quantity of tests and the complexity of DUT 50 (e.g., the HDL code representing the hardware to be validated). In the example in FIG. 2, shown purely for the sake of visual clarity, there are m sessions shown in FIG. 2, where SESSION_1 is a set of n runs 130, SESSION_2 is a set of p runs, and SESSION_m is a set of q runs, where m, n, p and q are integers.

Since enormous amounts of data are generated, in order to reduce the volume of data so as to speed up processing times, processor 20 may merge multiple runs 130 in one session 140, or alternatively merge the test data of multiple runs 130 in different sessions into one file (e.g., from SESSION_1, SESSION_2, . . . , SESSION_m). The coverage analyses described below may be then applied to the merged files with smaller data volumes. Moreover, the data in merged runs may be additionally encoded by an algorithm so as to further reduce data volumes.

In the huge volume of data generated in verification testing, reaching levels of some 50% test coverage of a particular coverage event may be easy to achieve. However, reaching higher coverages such as 80% coverage may be much harder to accomplish. This may involve executing and analyzing thousands of additional test runs 130. However, achieving higher coverage levels is not necessarily scalable with the number of test runs performed. In order to achieve higher coverage levels, test runs 130 are analyzed to determine under what conditions certain coverage events were hit. This often requires performing very time-consuming, manual coverage analyses of coverage events in the test runs.

Once the test data is obtained, the user may be interested in determining which coverage events occur during validation testing. The coverage events are the building blocks of the coverage model and defined in the coverage model. In the case of a functional coverage event, the user may be interested in identifying or correlating which runs that a coverage event occurs. One example of a functional coverage event is an overflow of FIFO (first in, first out) elements in DUT 50. In the case of a code coverage event, which lines of code and how many lines of the HDL source code were actually executed during runs 130 in each session 140, for example. Coverage tool 90 may analyze coverage events of interest typically defined in the coverage model or by the user.

In some embodiments of the present invention, in order to facilitate understanding of the coverage in test runs 130, coverage scores, or coverage grades, are typically applied to each run based on the coverage events that occur in a particular run. Verification environment 45 may then be configured to rank the large set of runs by ordering them in accordance with the scoring. Applying a coverage-based rank to the plurality of test runs is particularly useful since many of the test runs are redundant. For example, within 10,000 test runs, only 1,000 may have a coverage event of interest and the rest of the runs may be deemed by the user to be redundant. As such, the 1,000 test runs will obtain a higher rank than the rest of the test runs. In some embodiments, the ranking may be also used to determine the inputs to the DUT for the next regression, or session of test runs, to be performed on DUT 50. In some embodiments, the user can give waivers of coverage events not to be included in the ranking.

In some embodiments of the present invention, scores may be similarly applied to a plurality of merged runs based on the coverage events that occur in a particular merged run. Processor 20 then ranks the scored merged test runs.

In a specific test run(s), the user may expect a particular coverage grade for a certain part in the coverage model, and suddenly observe that, for given run(s), the coverage is much lower or much higher than expected. A coverage event that impacts an unexpected grade is known herein as a coverage event of interest, or a unique coverage event. A particular run in which a coverage event of interest, or unique coverage event, occurs is known herein as a contributing run, or a contributing test run. Thus, identifying unique coverage events and information about the specific conditions under which contributing runs are obtained and the number of instances of a contributing run of a particular coverage event is immensely valuable in improving overall coverage. Ranking as described above relates generally to coverage, that is how much of the coverage events are hit as defined by the coverage model, but has no information as to the contributing test runs, or to the uniqueness of events to the ranked events. In essence, unique coverage event analysis automates the analysis of coverage events that contributed to the change in grade.

Table I below further illustrates how coverage tool 90 in accordance with some embodiments of the present invention, can identify contributing test runs in two sample SESSIONS (e.g., session 140 in FIG. 2). Each coverage event denoted CE (e.g., CE1, CE2, etc.) in Table I is a coverage event defined in the coverage model. Processor 20 samples the data in test runs 130 in both SESSION_1 and SESSION_2. As shown in the Table, if a coverage event is sampled only in SESSION_1, this coverage event is considered unique in SESSION_1, and test runs 130 possessing that unique coverage event is flagged as a contributing test run, or unique test run. In some embodiments, the user may specify a maximal number of unique test runs to show per coverage event. Note that this table is shown merely for conceptual clarity and is not shown by way of limitation of the embodiments of the present invention.

TABLE I

Identifying contributing test runs

| | Sampled In SESSION_1 | Sampled In SESSION_2 | Reported unique in SESSION_1 |
|---|---|---|---|
| CE1 | YES | YES | NO |
| CE2 | YES (in 1 run) | NO | YES With 1 contributing test runs |
| CE3 | YES (in 15 runs) | NO | YES With 15 contributing test runs |
| CE4 | NO | NO | NO |

Analyzing the unique coverage events may be very useful in improving test coverage in the DUT. The plurality of test runs over multiple sessions had to be, in the past, manually inspected so as to identify where a particular (unique) coverage event was hit. In some embodiments of the present invention, the user opens two windows on output device 70 and visually parses the test runs in SESSION_1 and SESSION_2 as shown in Table I so as to identify the unique coverage events.

Figure 3:
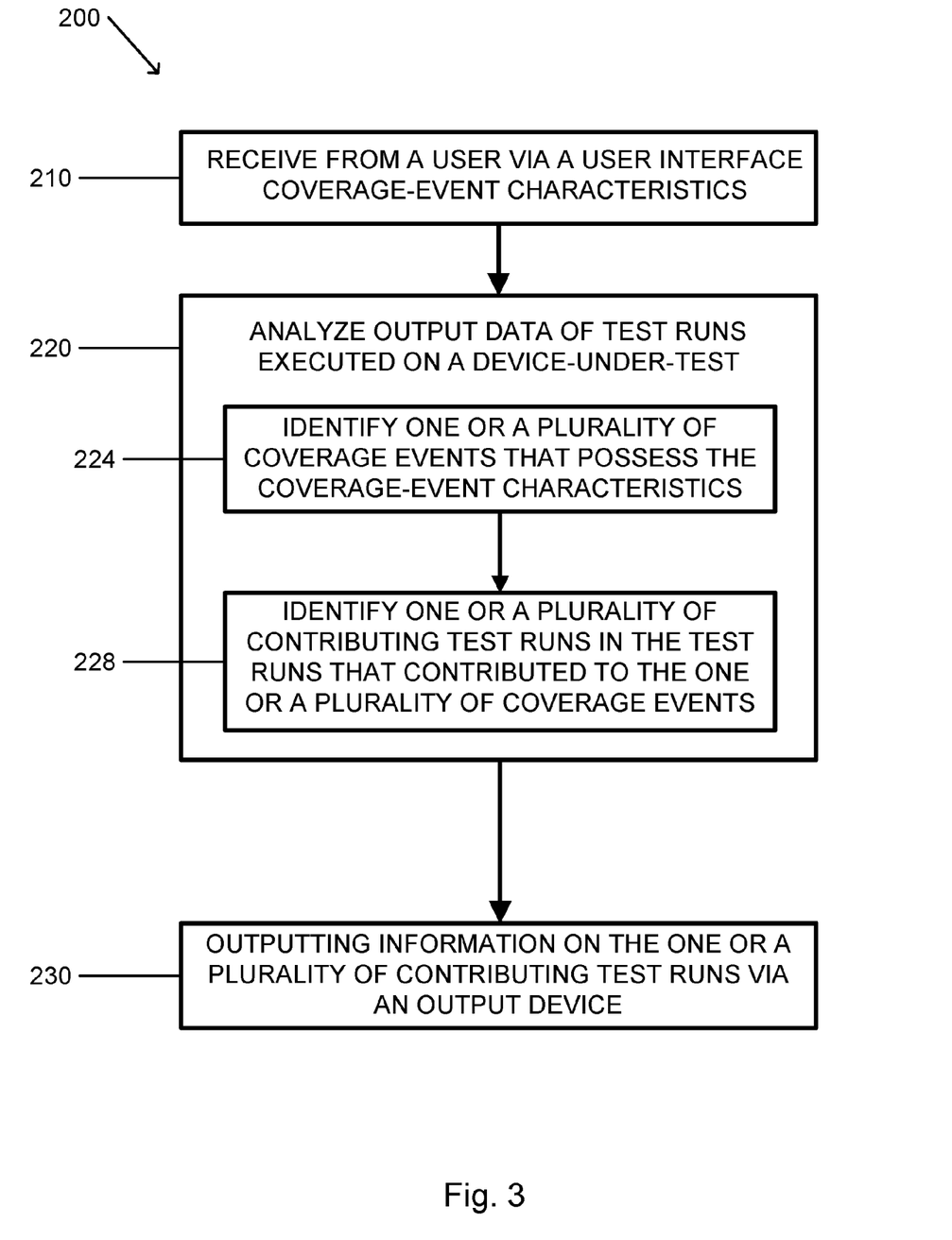
FIG. 3 schematically illustrates a method for automatically identifying coverage events of interest in verification test data, in accordance with some embodiments of the present invention.

FIG. 3 schematically illustrates a method 200 for automatically identifying coverage events of interest in verification test data, in accordance with some embodiments of the present invention. Method 200 includes receiving 210 coverage event characteristics from a user, via user interface 80.

Method 200 includes analyzing 220 output data of test runs 130 executed on DUT 50 using processor 20. Analyzing 220 the output data first includes identifying 224 one or a plurality of coverage events that possess the coverage event characteristics. Next, analyzing 220 also includes identifying 228 one or a plurality of contributing test runs in the test runs that contributed to the one or a plurality of coverage events.

The coverage event characteristics are the user-defined, uniqueness criteria that define the one or plurality of coverage events among a set of given coverage events. For example, the user may observe that, on Wednesday's regressions, there was coverage of the given coverage event, but on Thursday's regression, there was no coverage of the given coverage event. This is an indication that the regressions are not robust. For this example, the user-defined, coverage event characteristic is "to identify coverage events that were hit in Wednesday's regression, but not in Thursday's regression". Coverage tool 90 identifies those test runs in analyzing 220 the output data as in FIG. 3. In some embodiments, the test runs may include a merge of individual test runs.

Method 200 includes processor 20 outputting 230 information on the one or a plurality of contributing test runs, which can be observed on output device 70. For example, the information may include the identifier numbers of contributing test runs (e.g., that hit the given coverage event in Wednesday, but not Thursday's regression). This may be an indication that something in the source code may have changed, or certain lines in the source code were not executed.

The information outputted 230 may be used, for example, in locating errors in the source code so as to improve the overall coverage. In some embodiments, the outputted information is used to redefine the coverage characteristics for subsequent verification analyses, or redefine the generation model for subsequent verification testing. In some embodiments, the coverage analysis, and subsequently the coverage grade, can be improved by using the output information.

In some embodiments, parallel computing may be used to spread the analysis of the output data of test runs 130 described herein over a plurality of different machines, or processing units.

As regressions may typically have thousands of runs, processor 20 must analyze huge amounts of data. In some embodiments, so as to improve computation efficiency and speed, prior to 220, each test run 130 may be encoded with a representation of coverage contribution. In this case, the coverage points, or coverage events, in each of the test runs may be represented in just one or a few data bits so as to significantly reduce the data volume to be analyzed 220 as in FIG. 3.

In some embodiments, the user may invoke coverage tool 90 with the following "report_unique" command so as to find uniqueness among two runs or two sets of runs:
report_unique {-run1 <run> | -runfile1 <runfile> -run2 <run> | -runfile2 <runfile>}
[-out <out_path>]
[-uniq_run_count <count>]
[-uniq_metrics <metrics_type>]
[-counts]
[-sort high_count|low_count]
[analyzed_element_option]
Where:
 -run1 <run> -run2 <run> specifies 2 runs for analysis.
 -runfile1 <runfile> -runfile2 <runfile> specifies 2 sets of runs for analysis
 -uniq_metrics allows one to refine what leaf entities that the user is interested in analyzing.
 For example: bins only, bins/assertion.
 If not specified, all supported metrics will be analyzed.
 -uniq_run_count specifies the max number of contributing runs to display.
 If a uniq point is sampled more than <count>, we will report only first <count> and say that there are more.
 Default value is 1.
 Note that selecting high value for -uniq_run_count, may significantly impact the performance of the operation.
 analyzed_element_option::=-type <type> | -inst <instance>
 Let
 Allows the user to specify a sub tree to analyze
 Default value is to analyze upon all types/instances in the model.
 When using -counts, a count per the unique coverage event will be added to each reported contributing run.

By default, counters will not be collected/reported.
Using and enabling this option may significantly impact the performance of the operation.
the -sort option could be used in order to sort the runs by hit count (when -counts option is used) to one of the following values:
  low_count—runs will be sorted in an ascending order from a run with the least number of hits to the run with most number of hits.
    This option is valuable when trying to find most cost effective runs that hit this unique coverage event.
  high_count—runs will be sorted in an ascending order from a run with the most number of hits to the run with least number of hits.
    This option is valuable when trying to find runs that would most likely hit this unique bucket even with some modifications in the run.

In some embodiments of the present invention, the outputted 230 information may be in generated in Javascript Object Notation (Json) format and may also include a command parameters summary. A few examples of the outputted information in Json format, are as follows:

```
{
"command_input":{
  "analyzed_metrics": "covergroup",
  "runfile1": "../runs1",
  "runfile2": "../runs2",
  "report_counts": 1,
  "uniq_run_count": 3
},
"group_one_report":{
  "runfile": "../runs1",
  "compared_runfile": "../runs2",
  "summary":{
    "overall_unique_count": 2,
    "unique_coverbins_count": 2
  },
  "unique_entities":[
    {
      "type": "coverbin",
      "index": 0,
      "full_path": "sys/accending/x/4",
      "runs":[
        {"path": "cov_work/scope/count_by_seed_sn1", "count": 1},
        {"path": "cov_work/scope/count_by_seed_sn2", "count": 2},
        {"path": "cov_work/scope/count_by_seed_sn3", "count": 3}
      ],
      "hitting_runs": 5
    },
    {
      "type": "coverbin",
      "index": 1,
      "full_path": "sys/decending/x/4",
      "runs":[
        {"path": "cov_work/scope/count_by_seed_sn5", "count": 6},
        {"path": "cov_work/scope/count_by_seed_sn4", "count": 7},
        {"path": "cov_work/scope/count_by_seed_sn3", "count": 8}
      ],
      "hitting_runs": 5
    }
  ]
},
"group_two_report":{
  "runfile": "../runs2",
  "compared_runfile": "../runs1",
  "summary":{
    "overall_unique_count": 2,
    "unique_coverbins_count": 2
  },
  "unique_entities":[
    {
      "type": "coverbin",
      "index": 0,
      "full_path": "sys/accending/x/5",
      "runs":[
        {"path": "cov_work/scope/count_by_seed_sn6", "count": 6},
        {"path": "cov_work/scope/count_by_seed_sn7", "count": 7},
        {"path": "cov_work/scope/count_by_seed_sn8", "count": 8}
      ],
      "hitting_runs": 5
    },
    {
      "type": "coverbin",
      "index": 1,
      "full_path": "sys/decending/x/5",
      "runs":[
        {"path": "cov_work/scope/count_by_seed_sn10", "count": 1},
        {"path": "cov_work/scope/count_by_seed_sn9", "count": 2},
        {"path": "cov_work/scope/count_by_seed_sn8", "count": 3}
      ],
      "hitting_runs": 5
    }
  ]
}
}
```

In some embodiments of the present invention, coverage tool 90 may include an enhanced command for defining unique criteria, or coverage-event characteristics, that are received 210 via a user interface, over a set of runs instead of two runs/set of runs.

This unique criteria then can be used with or without specifying '-run2' or 'runfile2' options:
  If used without -run2 or -runfile2, the report will present the list of runs in '-runfile1' that meet this criteria for each coverage event. This use case could be considered as a smart correlation operation:
  In regular correlation flow, a single coverage event is selected, in order to look at some property value of this coverage event in a selected group of runs. Using this report_unique use case, instead of selecting one coverage event to look at, the user will be able to just define criteria. The generated report will include all coverage events for which the criteria is met in at least one run, and a list of all runs where the criteria was met for each coverage event.
  If used with -run2 or -runfile2, the report will only list coverage events that meet the uniqueness criteria in one run group, but do not meet the criteria in the other group. This use case might be useful in comparing the effectiveness of two run groups (for example, which run group tends to hit coverage events less excessively than another), before selecting which run group to add to the regression.

When applying "report_unique" command on two runs/set of runs, the uniqueness is defined to be difference among the two runs/set. When applying "report_unique" command on a single set of runs, the user needs to define the uniqueness criteria. The "report_unique" command thus may include a "-uniq_criteria" option, which defines what is the criteria that needs to be checked for uniqueness and "-criteria_value" is the value associated with the selected criteria. Possible values for these coverage event unique criteria options are defined in Table II below.

TABLE II

Specifying coverage event characteristics (uniq_criteria)

| -uniq_criteria | -criteria_value | Description |
| --- | --- | --- |
| hit | — | A coverage event that hits at-least once (default, same behavior as command in first phase) |

TABLE II-continued

Specifying coverage event characteristics (uniq_criteria)

| -uniq_criteria | -criteria_value | Description |
|---|---|---|
| count_at_least | <value> | A coverage event that hits atleast <value> times in a single run (could be used to find coverage events that are sampled excessively inside a run - might help with saving performance per specific run). |
| count_at_most | <value> | A coverage event that hits at least once but not more than <value> times in a single run (might help to identify cost effective runs) |
| runs_hit_atleast | <value> | A coverage event that is covered by atleast <value> runs in the run group run (could be used to find coverage events that are sampled excessively in the rungroup - might help with saving performance in some of the hitting runs). |
| runs_hit_at_most | <value> | A coverage event that hits at least in one run, but not in more than <value> runs in the rungroup |
| test_unique | — | A coverage event that hits in some runs of a single test bunt not hit by any runs of other tests. |
| sim_excluded | — | A coverage event that is marked as simulation excluded in run |

In some embodiments of the present invention, the "report_unique" command may include an option to perform ranking on unique coverage events, or coverage events of interest in accordance with the following flow: First, verification environment 45 (e.g., processor 20) executes a regression on a first group of test runs. Processor 20 then ranks the test runs in the first group. Verification environment 45 (e.g., processor 20) executes a second regression on a new second group of test runs. The user can then run "report_unique" between the two groups of runs based on the coverage-event characteristics. Along with ranking for the second group based only on the events that are defined in the coverage-event characteristics, only the runs from the second group which had unique coverage events that occurred in the second group compared to the first group are ranked. In essence, this provides the user with an efficient incremental ranking wherein the two ranking operations described above result in a union of the resulting test runs of the first ranking operation and the test runs of the second rank operation. The "report_unique" command in this case automates the entire flow described above by calculating the unique events and using them to have a more efficient way of ranking all of the tests.

Some embodiments are described hereinabove with reference to flowcharts and/or block diagrams depicting methods, systems and computer program products according to various embodiments.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method comprising: receiving from a user, via a user interface, coverage-event characteristics that define one or a plurality of coverage events, each coverage event including a functionality of a device-under-test that comprises a software emulation of a hardware component that is to be executed during a plurality of test runs, and criteria that define one or a plurality of unique coverage events;
executing said plurality of test runs on the device-under-test;
using a processor, analyzing output data of said plurality of test runs to identify in the output data said one or a plurality of coverage events that occurred during said plurality of test runs and applying a coverage grade to each of said plurality of test runs, the coverage grade based on coverage events of said one or a plurality of coverage events that occurred during that test run;
using the processor, using the criteria to identify one or a plurality of contributing test runs among said plurality of test runs, each contributing test run having an unexpected coverage grade and during which a unique coverage event of said one or a plurality of unique coverage events occurred; and
outputting information indicating said one or a plurality of contributing test runs via an output device.

2. The method of claim 1, wherein analyzing the output data comprises analyzing the output data of individual test runs.

3. The method of claim 1, wherein analyzing the output data comprises analyzing the output data of merges of individual test runs.

4. The method according to claim 1, wherein the device-under-test comprises a hardware device.

5. A non-transitory computer readable storage medium having stored thereon instructions that when executed by a processor will cause the processor to:
receive from a user, via a user interface, coverage-event characteristics that define one or a plurality of coverage events, each coverage event including a functionality of a device-under-test that comprises a software emulation of a hardware component that is to be executed during a plurality of test runs, and criteria that define one or a plurality of unique coverage events;
execute said plurality of test runs on the device-under-test;
analyze output data of said plurality of test runs to identify in the output data said one or a plurality of coverage events that occurred during said plurality of test runs and apply a coverage grade to each of said plurality of test runs, the coverage grade based on coverage events of said one or a plurality of coverage events that occurred during that test run;
use the criteria to identify one or a plurality of contributing test runs among said plurality of test runs, each contributing test run having an unexpected coverage grade and during which a unique coverage event of said one or a plurality of unique coverage events occurred; and
output information indicating said one or a plurality of contributing test runs via an output device.

6. The non-transitory computer readable storage medium according to claim 5, wherein analyzing the output data comprises analyzing the output data of individual test runs.

7. The non-transitory computer readable storage medium according to claim 5, wherein analyzing the output data comprises analyzing the output data of merges of individual test runs.

8. A system comprising:
a processor and a memory, the processor configured to:
receive from a user, via a user interface, coverage-event characteristics that define one or a plurality of coverage events, each coverage event including a functionality of a device-under-test that comprises a software emulation of a hardware component that is to be executed during a plurality of test runs, and criteria that define one or a plurality of unique coverage events;

execute said plurality of test runs on the device-under-test;

analyze output data of said plurality of test runs to identify in the output data said one or a plurality of coverage events that occurred during said plurality of test runs and apply a coverage grade to each of said plurality of test runs, the coverage grade based on coverage events of said one or a plurality of coverage events that occurred during that test run;

use the criteria to identify one or a plurality of contributing test runs among said plurality of test runs, each contributing test run having an unexpected coverage grade and during which a unique coverage event of said one or a plurality of unique coverage events occurred; and output information indicating said one or a plurality of contributing test runs via an output device.

9. The system according to claim 8, wherein analyzing the output data comprises analyzing the output data of individual test runs.

10. The system according to claim 8, wherein analyzing the output data comprises analyzing the output data of merges of individual test runs.

11. The system according to claim 8, wherein the device-under-test comprises a hardware device.

\* \* \* \* \*